United States Patent [19]

Faulkenberry et al.

[11] 4,114,108
[45] Sep. 12, 1978

[54] OVERDRIVE PROTECTION CIRCUIT

[75] Inventors: Wayne J. Faulkenberry; Henry W. Riviere, both of Lynchburg, Va.

[73] Assignee: General Electric Company, Lynchburg, Va.

[21] Appl. No.: 798,655

[22] Filed: May 19, 1977

[51] Int. Cl.² ............................................. H03F 21/00
[52] U.S. Cl. ................................. 330/207 P; 325/150; 325/159
[58] Field of Search ........................ 325/150, 151, 159; 330/207 P

[56] References Cited

U.S. PATENT DOCUMENTS

| 3,641,451 | 2/1972 | Hollingsworth et al. | 325/151 X |
| 3,852,669 | 12/1974 | Bowman et al. | 325/151 |
| 4,019,150 | 4/1977 | Lurey et al. | 325/150 X |

Primary Examiner—Lawrence J. Dahl
Attorney, Agent, or Firm—James J. Williams

[57] ABSTRACT

A radio frequency power amplifier is frequently provided with a feedback circuit to maintain the output power of the amplifier at a predetermined level. When the load connected to the amplifier changes, the feedback circuit causes the amplifier to produce the amount of power needed to maintain the predetermined level of power. If additional power is produced, it may be large enough to damage or destroy the amplifier and other circuits. A protection circuit is provided to prevent this. The protection circuit uses a differential amplifier having a first input provided by an output power sensor, a second input provided by a reference voltage, and an output for controlling the supply power to the radio frequency power amplifier. The two inputs are adjusted so that the differential amplifier becomes saturated when the sensed output radio frequency power is at some selected safe level above the normal output power level. The selected level permits tolerances in the radio frequency amplifier, but protects the radio frequency amplifier against producing excess power, regardless of changes in the load.

6 Claims, 2 Drawing Figures

OVERDRIVE PROTECTION CIRCUIT

BACKGROUND OF THE INVENTION

Our invention relates to an overdrive protection circuit, and particularly to an overdrive circuit that permits the output power of a radio frequency amplifier to be maintained at a predetermined level, but that prevents the output power from exceeding the predetermined level by more than a predetermined amount despite changes in the load connected to the radio frequency amplifier.

Radio frequency power amplifiers have been provided with feedback circuits or levelling loops which maintain the radio frequency power output at a selected level, despite changes in the load. For example, a radio frequency amplifier may supply power to a radiating antenna which may present an impedance that varies considerably where such an antenna and amplifier are on an automobile. As the automobile moves around, it may be in an open area where there is no reflection, so that the antenna presents the proper impedance. However, in cities or other locations, the antenna may be close to a metallic body which causes considerable reflection, thus raising the impedance presented by the antenna. In the prior art feedback circuits, this increased impedance caused the feedback circuit to provide a signal that increased the power output from the amplifier. Such a condition often damaged or destroyed the amplifier and associated circuit. The prior art overcame this problem with a circuit that limited the available radio frequency drive signal. However, limiting the radio frequency drive also limits the output power that can be obtained from the radio frequency power amplifier. If, as is normal, manufacturing and component tolerances were allowed for the amplifier, some amplifiers could not produce the nominal power output needed for the transmitter.

Accordingly, a primary object of our invention is to provide a new and improved overdrive protection circuit that limits the power produced by a radio frequency power amplifier without limiting the available radio frequency drive.

Another object of our invention is to provide a new and improved overdrive protection circuit to be used with a radio frequency amplifier having a feedback circuit for maintaining the output power at a predetermined level, the overdrive protection circuit being capable of preventing the amplifier output power from exceeding the predetermined level by more than a predetermined amount, despite changes in the amplifier load.

Another object of our invention is to provide a new and improved overdrive protection circuit that limits the power produced by a radio frequency amplifier to a selected level above normal, despite the fact that the radio frequency amplifier has a feedback loop that is intended to keep the output power at a normal level and despite the fact that the radio frequency drive to the amplifier can be as large as needed to compensate for manufacturing and component tolerances.

SUMMARY OF THE INVENTION

Briefly, these and other objects are achieved in accordance with our invention with a differential amplifier connected in the feedback loop of a radio frequency amplifier for maintaining the output power of the amplifier at a selected level. The differential amplifier is provided with an input from a reference voltage and an input from a radio frequency amplifier power sensor. The output of the differential amplifier controls the power supply provided to the radio frequency amplifier, and hence controls the radio frequency power output. The inputs to the differential amplifier are set or adjusted so that the differential amplifier output becomes saturated at some selected safe level above the normal radio frequency power level. With a normal radio frequency amplifier load, the differential amplifier output causes the radio frequency amplifier to maintain a normal power level. For an increased load, the differential amplifier becomes saturated at the selected safe level, so that the radio frequency amplifier is protected, even if it is overdriven.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF A PREFERRED EMBODIMENT

Figure 1:
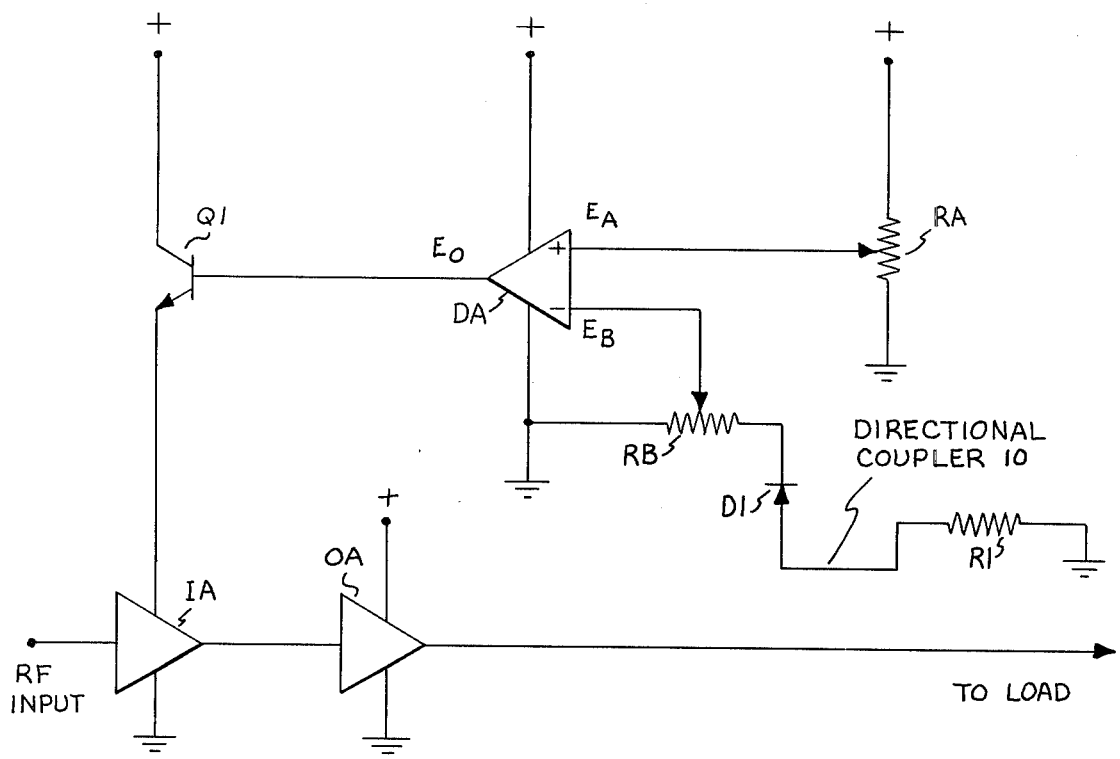
FIG. 1 shows a schematic diagram of a preferred overdrive protection circuit in accordance with our invention.

In FIG. 1, we have illustrated use of our invention with a radio frequency amplifier circuit having an input amplifier IA which is supplied with radio frequency drive or input signals. In order to compensate for manufacturing and component tolerances, these drive or input signals have more power than is necessary. The output of the input amplifier IA is supplied to the input of an output radio frequency amplifier OA, which provides suitable power amplification and produces the amplified signal at an output which is connected to a load. Typically, such a circuit would be used in a radio transmitter, and the load would be the radiating antenna. As mentioned, the antenna may present varying impedances, particularly if on a moving vehicle. And, the antenna may be short-circuited to ground under certain circumstances. Hence, a need exists to protect the radio frequency amplifiers from trying to supply too much power under these varying conditions. The power supplied by the output amplifier OA to the load is sensed by a directional coupler 10 which produces a voltage whose magnitude varies as a function of (usually in a direct relation) the power traveling from the amplifier OA to the load. One end of the directional coupler 10 is connected through a resistor R1 to a point of reference potential or ground, and the other end of the coupler 10 is connected through a rectifying diode D1 and a resistor RB to ground. The movable tap on the resistor RB supplies a voltage $E_B$ to the minus input of a differential amplifier DA. The positive input of the amplifier DA is supplied with a voltage $E_A$ from a movable tap on a resistor RA. The resistor RA is connected between a positive reference voltage and ground. The output voltage $E_0$ of the differential amplifier DA is supplied to the base of an NPN control transistor Q1 for controlling the direct current supplied to the amplifier IA. The collector of the transistor Q1 is connected to a suitable positive voltage, and the emitter of the transistor Q1 is connected to the positive supply voltage input terminal of the input amplifier IA. Changes in the base voltage of the transistor Q1 change the current supplied from the collector to the emitter, and hence change the direct current supplied to the amplifier IA. Suitable direct current voltages are also supplied to the differential amplifier DA and the output amplifier OA.

Figure 2:
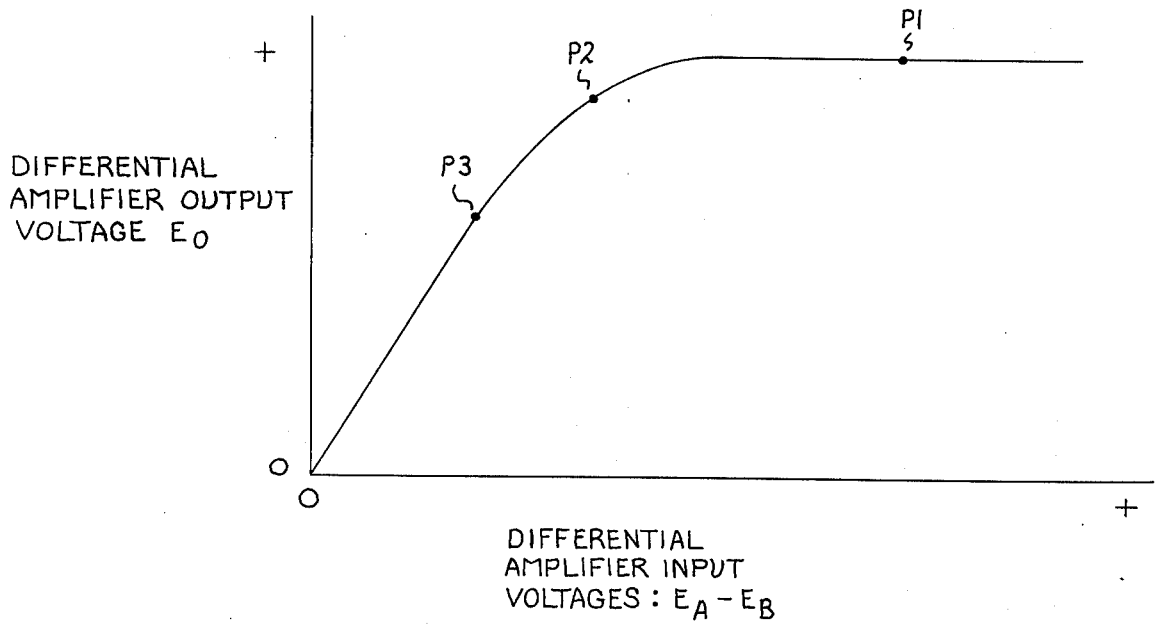
FIG. 2 shows a wave form for illustrating the adjustment and operation of our overdrive protection circuit.

Adjustment and operation of the circuit of FIG. 1 will be described in connection with FIG. 2. FIG. 2 shows the output voltage $E_0$ of the differential amplifier DA for various differences between the voltage $E_A$ at the plus input and the voltage $E_B$ at the minus input. A proper load is connected to the output of the amplifier OA, and the normal drive power (sufficient to offset circuit differences and variations) is supplied to the input of the amplifier IA. The movable tap on the resistor RB is moved to its lowest point (ground potential), so that the voltage $E_B$ supplied to the minus input is zero. The movable tap on the resistor RA is moved to its highest level, so that the voltage $E_A$ supplied to the plus input is at its maximum value. This condition saturates the differential amplifier DA so that its output voltage $E_0$ is also at a maximum saturated value. Under this condition, the transistor Q1 supplies the maximum direct current to the input amplifier IA. In FIG. 2, this condition is represented by the point P1. Next, the movable tap of the resistor RB is adjusted to increase the voltage $E_B$ at the minus input. This decreases the direct current supplied to the amplifier IA. The voltage $E_B$ is increased until the output power supplied by the amplifer OA is at some selected level of percentage over its nominal value, say 110%. This adjustment brings the amplifier DA out of saturation to some degree, and places its operation at point P2. Next, the movable tap on the resistor RA is moved downward to decrease the voltage $E_A$ supplied to the plus input. This decreases the direct current supplied to the amplifier IA. The voltage $E_A$ is decreased until the output power from the amplifier OA is at its nominal or normal value. This adjustment places the operation of the differential amplifier DA in its linear range at the point P3.

After these adjustments have been made, the radio frequency amplifier circuit may be operated safely despite changes in load and over a wide range of radio frequency drive power. If the load connected to the output amplifier OA increases in impedance (as it would if the load were an antenna that received reflected signals), the output power sensed by the coupler 10 would be reduced. This would decrease the voltage $E_B$, and produce a greater difference between the voltage $E_A$ which is fixed and the decreased voltage $E_B$. Regardless of this difference, the circuit was previously adjusted so that once the difference reached a predetermined magnitude, the amplifier DA became saturated, and no more direct current could be supplied to the input amplifier IA. Hence, the amplifier IA has its output power limited, despite the presence of a large radio frequency drive power. This condition protects amplifier IA and the output amplifier OA. Under normal load conditions, the feedback circuit or loop maintains the power at the normal level. Under abnormal load conditions (high or low impedance), the overdrive protection circuit permits a predetermined increase, but no more. Thus, the amplifiers can be built with reasonable tolerances and can be overdriven to offset these tolerances and produce the needed, normal radio frequency power, and still be protected against severe changes in load conditions.

In summary, it will be seen that we have provided a new and improved overdrive protection circuit that can be easily adjusted to protect a radio frequency amplifier from being overdriven, but that also permits the amplifier to maintain a desired normal level of power output. While we have shown only one embodiment, persons skilled in the art will appreciate the modifications that can be made. For example, the differential amplifier DA may be supplied with plus and minus voltages so that the output voltage $E_0$ varies between plus and minus voltages. More or less stages may be provided in the radio frequency amplifier circuit. The directional coupler 10 may take various forms, depending upon the type of transmission lines used and the frequencies of operation. And the steps of adjustment may be varied. Therefore, while the invention has been described with reference to a particular embodiment, it is to be understood that modifications may be made without departing from the spirit of the invention or from the scope of the claims.

What we claim as new and desire to secure by Letters Patent of the United States is:

1. An overdrive protection circuit for a radio transmitter or the like having a radio frequency amplifier circuit with an input, a control terminal, and an output, said protection circuit comprising:
    a. means for sensing the magnitude of radio frequency power produced at said radio frequency amplifier output and producing a first voltage whose magnitude is related to the magnitude of radio frequency power;
    b. means for deriving a predetermined part of said first voltage;
    c. means for producing a reference voltage;
    d. means for deriving a predetermined part of said reference voltage;
    e. means for comparing said predetermined part of said first voltage with said predetermined part of said reference voltage and producing a control signal whose magnitude varies as a function of said compared predetermined parts within a safe predetermined range, and whose magnitude is limited to a predetermined safe value outside said safe predetermined range;
    f. and means connecting said comparing means to said control terminal of said radio frequency amplifier circuit for applying said control signal to said control terminal and controlling the power produced by said radio frequency amplifier circuit as a function of the magnitude of said control signal.

2. The protection circuit of claim 1 wherein said first voltage and said reference voltage are direct current.

3. The protection circuit of claim 1 wherein said first voltage and said reference voltage are direct current, and wherein said control signal magnitude varies as a function of the difference between said compared predetermined parts.

4. The protection circuit of claim 3 wherein said deriving means for producing said first voltage comprise a directional coupler.

5. An overdrive protection circuit for a radio transmitter or the like having a radio frequency amplifier circuit with an input, a control terminal, and an output, said protection circuit comprising:
    a. first means for producing a feedback direct current voltage whose magnitude varies directly with radio frequency power produced by said radio frequency amplifier circuit;
b. second means coupled to said first means for adjusting the magnitude of said feedback voltage;
c. third means for producing a reference direct current voltage;
d. fourth means coupled to said third means for adjusting said reference voltage;
e. a differential amplifier having a plus input, a minus input, and an output;
f. means coupling said plus input to said fourth means and said minus input to said second means;
g. a power control circuit connected between said differential amplifier output and said radio frequency amplifier circuit for controlling the direct current applied to said radio frequency amplifier circuit as a function of the voltage at said differential amplifier output;
h. said feedback and reference voltages being adjusted to cause said differential amplifier to saturate in response to a predetermined difference between said reference and feedback voltages, and to operate linearly in response to less than said predetermined difference betewen said reference and feedback voltages.

6. A method for protecting a radio frequency amplifier against overdrive, said amplifier being provided with a feedback and protection circuit having means for supplying a first voltage indicative of the output of said radio frequency amplifier, means for supplying a reference voltage, a differential amplifier having its inputs connected to said means for receiving said voltages, and a power control circuit connected between said differential amplifier output and said radio frequency amplifier, said method comprising the steps of:
a. applying a proper drive and load to said radio frequency amplifier;
b. adjusting said first voltage to zero;
c. adjusting said reference voltage to a maximum that saturates said differential amplifier and causes said radio frequency amplifier to produce maximum output power;
d. increasing said first voltage to reduce said output power to an acceptable excess level;
e. and decreasing said reference voltage to reduce said output power to the proper normal level below said acceptable excess level.

* * * * *